(12) United States Patent
Liu

(10) Patent No.: US 11,502,211 B2
(45) Date of Patent: Nov. 15, 2022

(54) FINGERPRINT IDENTIFICATION STRUCTURE AND DISPLAY PANEL

(71) Applicant: WUHAN CHINA STAR OPTOELECTRONICS TECHNOLOGY CO., LTD., Wuhan (CN)

(72) Inventor: Zhi Liu, Wuhan (CN)

(*) Notice: Subject to any disclaimer, the term of this patent is extended or adjusted under 35 U.S.C. 154(b) by 300 days.

(21) Appl. No.: 16/772,786

(22) PCT Filed: Mar. 20, 2020

(86) PCT No.: PCT/CN2020/080361
§ 371 (c)(1),
(2) Date: Jun. 14, 2020

(87) PCT Pub. No.: WO2021/168089
PCT Pub. Date: Aug. 26, 2021

(65) Prior Publication Data
US 2022/0131019 A1 Apr. 28, 2022

(30) Foreign Application Priority Data
Feb. 21, 2020 (CN) .......................... 202010107676.6

(51) Int. Cl.
*G06V 40/13* (2022.01)
*H01L 31/0232* (2014.01)
(Continued)

(52) U.S. Cl.
CPC ........ *H01L 31/02327* (2013.01); *G02F 1/313* (2013.01); *G06V 40/1318* (2022.01); *H01L 31/165* (2013.01)

(58) Field of Classification Search
CPC ............. H01L 31/02327; H01L 31/165; H01L 27/3225–323; H01L 27/3234;
(Continued)

(56) References Cited

U.S. PATENT DOCUMENTS

| 5,942,761 A | * | 8/1999 | Tuli | .................. | G06V 40/1335 |
| | | | | | 250/556 |
| 2011/0170750 A1 | * | 7/2011 | Kropp | ................ | A61B 5/02444 |
| | | | | | 382/124 |

(Continued)

FOREIGN PATENT DOCUMENTS

| CN | 106228144 A | 12/2016 |
| CN | 206115085 U | 4/2017 |

(Continued)

OTHER PUBLICATIONS

Translation of CN206115085U (Year: 2017).*

*Primary Examiner* — Roberto W Flores

(57) ABSTRACT

A fingerprint identification structure and a display panel are disclosed. display panel includes a fingerprint identification structure. The fingerprint identification structure includes a light energy switch and a thermosensitive light path adjustment structure. The light energy switch is configured to switch from an open circuit to a closed circuit under light irradiation. The thermosensitive light path adjustment structure is connected to a surface of the light energy switch, is able to transmit light internally, and is configured to adjust a light path of light to drive the light to irradiate the light energy switch when receiving a heat source.

9 Claims, 5 Drawing Sheets

(51) Int. Cl.
    *G02F 1/313*     (2006.01)
    *H01L 31/16*     (2006.01)

(58) Field of Classification Search
    CPC .. G02F 1/313; G06V 40/1318; G06V 10/147; G06V 40/12–1394
    See application file for complete search history.

(56) References Cited

U.S. PATENT DOCUMENTS

| | | | |
|---|---|---|---|
| 2012/0062364 A1* | 3/2012 | Rowe | A61B 5/0075 340/5.82 |
| 2018/0060642 A1 | 3/2018 | Kim et al. | |
| 2019/0102593 A1 | 4/2019 | Wang et al. | |
| 2021/0358984 A1* | 11/2021 | Liu | H01L 27/14623 |

FOREIGN PATENT DOCUMENTS

| | | |
|---|---|---|
| CN | 107563354 A | 1/2018 |
| CN | 107784262 A | 3/2018 |
| CN | 107798278 A | 3/2018 |
| KR | 101923320 B1 | 11/2018 |

\* cited by examiner

FINGERPRINT IDENTIFICATION STRUCTURE AND DISPLAY PANEL

FIELD OF INVENTION

The present invention relates to a field of displays, especially relates to a fingerprint identification structure and a display panel.

BACKGROUND OF INVENTION

Fingerprint identification has been widely used in many fields such as mobile phones, tablets, and time attendance due to its good security and ease of use.

At present, fingerprint identification has become the standard for consumer electronics such as cell phones, tablets, and laptops. Each terminal manufacturer is developing the corresponding fingerprint identification technology.

Therefore, the technology trend of in-screen fingerprint identification has risen in recent years. However, the in-screen fingerprint identification currently on the market is mainly attaching an optical or ultrasonic fingerprint module under the screen. Such structure can be very convenient for a user's operation. However, because the fingerprint module is attached, the thickness of the display panel module on the front of the mobile phone is increased, which affects the design of the whole machine mechanism and also increases product costs.

SUMMARY OF INVENTION

Technical Issue

The present invention provides a fingerprint identification structure and a display panel to solve the technical issue that a conventional fingerprint identification structure disposed with a fingerprint module has a great thickness and a high cost.

Technical Solution

To solve the above issue, the present invention provides a fingerprint identification structure, comprising a light energy switch and a thermosensitive light path adjustment structure; the light energy switch configured to switch an open circuit into a closed circuit under light irradiation; and the thermosensitive light path adjustment structure connected to a surface of the light energy switch, capable of transmitting light internally, configured to adjust a light path of light to prevent the light from irradiating the light energy switch when receiving no heat source, and configured to adjust the light path of the light to drive the light to irradiate the light energy switch when receiving a heat source; wherein the heat source is a temperature of a fingerprint ridge.

Furthermore, the light energy switch comprises a semiconductor layer, a source electrode, and a drain electrode; an upper surface of the semiconductor layer connected to the thermosensitive light path adjustment structure, and configured to convert from a semiconductor state thereof into a conductor state thereof under light irradiation; the source electrode electrically connected to an end of a lower surface of the semiconductor layer; and the drain electrode electrically connected to another end of the lower surface of the semiconductor layer.

Furthermore, the thermosensitive light path adjustment structure comprises light selective transmission layer, a light transmission layer, a light direction control layer, and a light source; specifically, the light selective transmission layer disposed on the thermosensitive light path adjustment structure; the light transmission layer disposed on the light selective transmission layer and configured to transmit light; the light direction control layer disposed on the light transmission layer and configured to receive the heat source and control a reflection direction of the light under effect of the heat source; and the light source disposed on a side of the light transmission layer and configured to provide the light, wherein an incident angle of the light is greater than a total reflection angle of the light selective transmission layer.

Furthermore, a refractive index of the light selective transmission layer is less than a refractive index of the light transmission layer.

Furthermore, when no heat source is received, a refractive index of the light direction control layer is equal to the refractive index of the light transmission layer and the refractive index of the light direction control layer is equal to the refractive index of the light transmission layer; and when the heat source is received, the refractive index of the light direction control layer is unequal to the refractive index of the light transmission layer, and the light direction control layer reflects and transmits the light to pass through the light selective transmission layer to the thermosensitive light path adjustment structure.

Furthermore, the light direction control layer comprises a diffuse reflection surface with concave and convex, and the diffuse reflection surface is connected to the light transmission layer.

Furthermore, the light transmission layer comprises a plurality of recesses/holes, and the light transmission layer is disposed in the recesses/holes.

Furthermore, the diffuse reflection surface comprises a plurality of reflection units, and a shape and a dimension of each of the reflection units matches a shape and a dimension of each of the recesses/holes.

Furthermore, the reflection units are semi-spherical and are arranged in an array.

The present invention also provides a display panel, comprising the fingerprint identification structure as described above.

Advantages

The technical effect of the present invention is to provide a fingerprint identification structure and a display panel that lower a manufacturing cost by setting forth a fingerprint identification structure similar to a TFT device with a less thickness and without a fingerprint module. Also, the fingerprint identification structure can be integrated into a display panel, which lowers a thickness and a cost of the display panel.

DESCRIPTION OF DRAWINGS

Specific embodiments of the present invention are described in details with accompanying drawings as follows to make technical solutions and advantages of the present invention clear.

FGI. 1 is a schematic structural view of a fingerprint identification structure of an embodiment of the present invention;

FGI. 2 is a schematic structural view of arrangement of the source electrode and the drain electrode of the embodiment of the present invention; and FGI. 3 is a principle view of the fingerprint identification structure of the embodiment of the present invention receiving no heat source;

FGI. 4 is a principle view of the fingerprint identification structure of the embodiment of the present invention receiving the heat source; and FGI. 5 is a schematic structural view of a display panel of the embodiment of the present invention.

Figure 1:
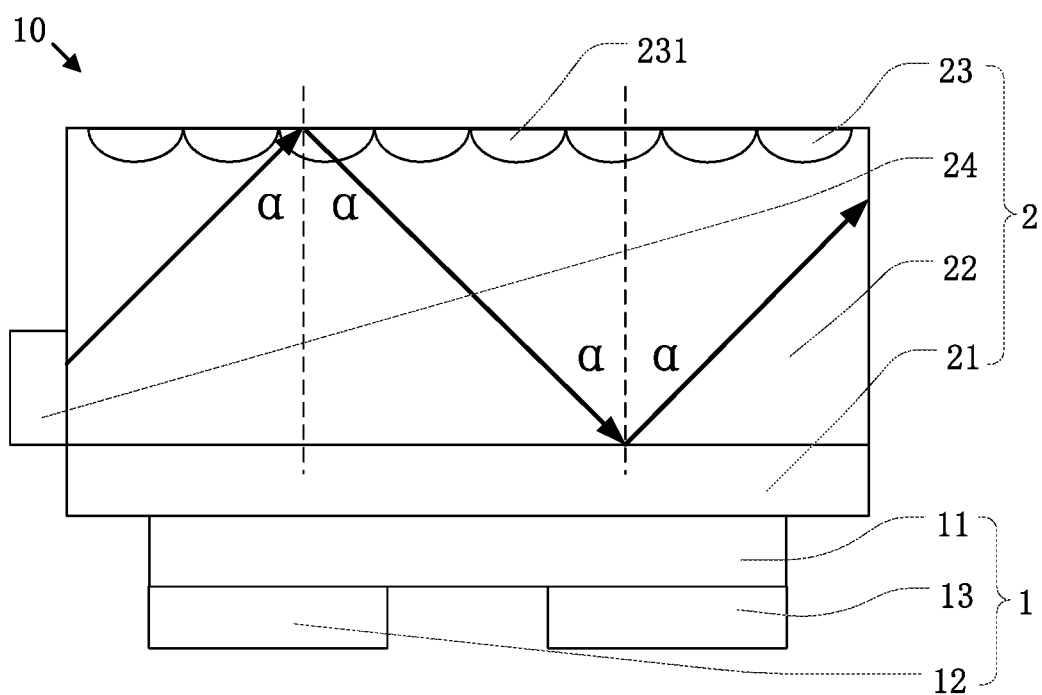

REFERENCE CHARACTERS IN THE FIGURES 1, light energy switch, 2, thermosensitive light path adjustment structure, 10, fingerprint identification structure, 11, semiconductor layer, 12, source electrode, 13, drain electrode, 21, light selective transmission layer, 22, light transmission layer, 23, light direction control layer, 24, light source, 100, display panel, 231, reflection units.

DETAILED DESCRIPTION OF PREFERRED EMBODIMENTS

The technical solution in the embodiment of the present invention will be clearly and completely described below with reference to the accompanying drawings in the embodiments of the present invention. Apparently, the described embodiments are merely some embodiments of the present invention instead of all embodiments. According to the embodiments in the present invention, all other embodiments obtained by those skilled in the art without making any creative effort shall fall within the protection scope of the present invention.

In the description of the present invention, it should be noted that unless clear rules and limitations otherwise exist, terminologies "install", "connect", "connection" should be understood in a broad sense. For instance, the connection can be a fixed connection, a detachable connection or an integral connection. The connection can be a mechanical connection, an electrical connection or a telecommunication. The connection can be a direct connection, an indirect connection through an intermedium, can be an internal communication between two elements or an interaction between the two elements. For a person of ordinary skill in the art, the specific meaning of the above terminology in the present invention can be understood on a case-by-case basis.

Each of the following embodiments is described with appending figures to illustrate specific embodiments of the present invention that are applicable. The terminologies of direction mentioned in the present invention, such as "upper", "lower", "front", "rear", "left", "right", "inner", "outer", "side surface", etc., only refer to the directions of the appended figures. Therefore, the terminologies of direction are used for explanation and comprehension of the present invention, instead of limiting the present invention. In the figures, units with similar structures are marked with the same reference characters.

Figure 3:
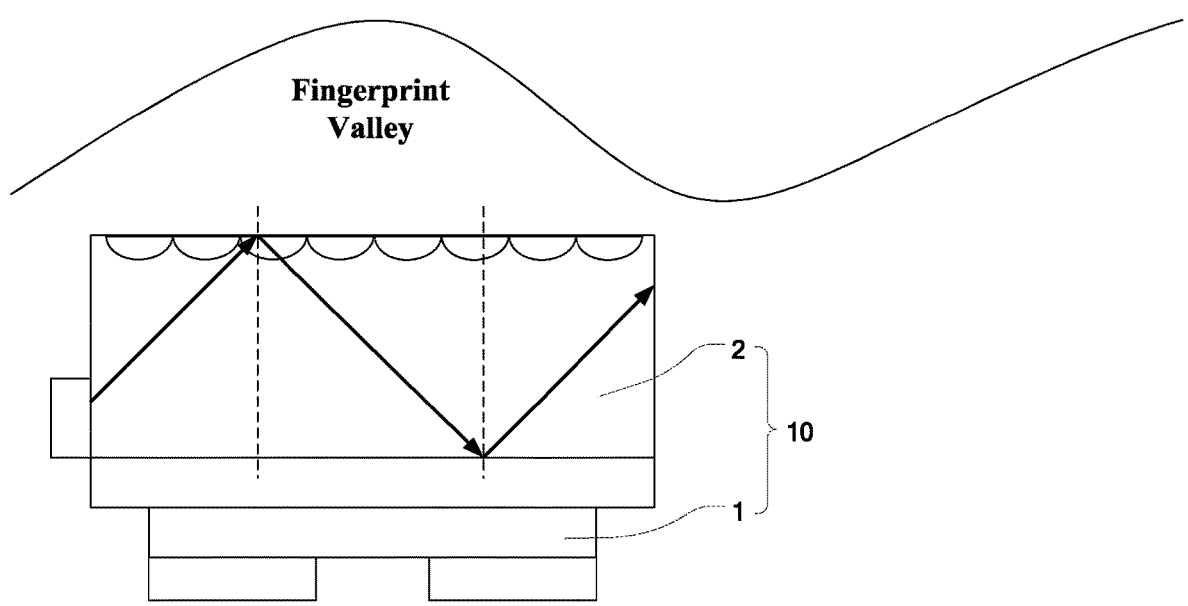
Figure 4:
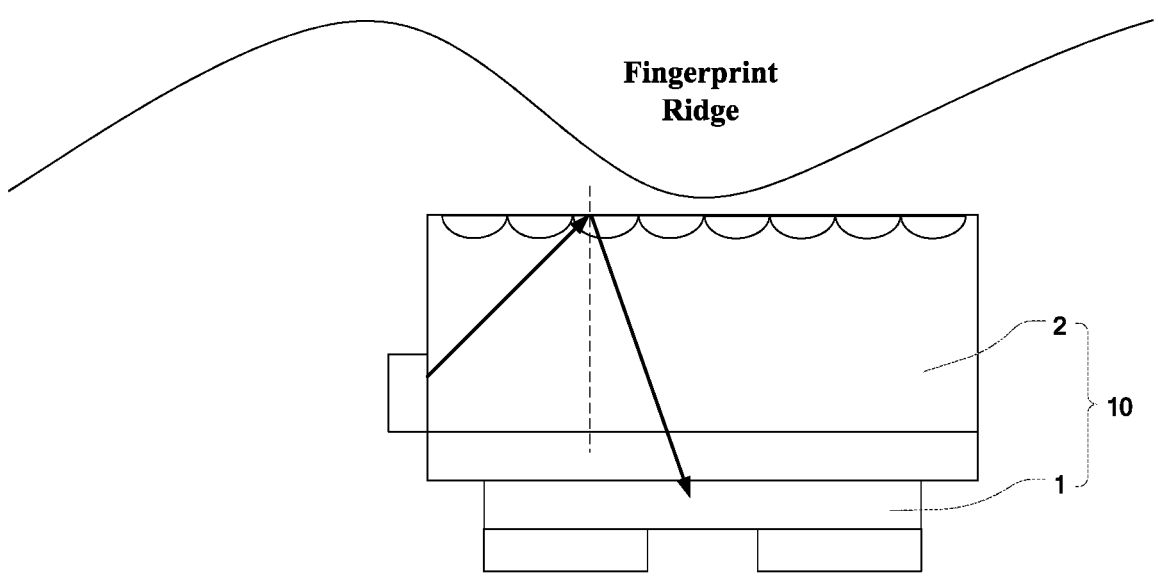

With reference to FIGS. 1, 3, and 4, the embodiment of the present invention provides a fingerprint identification structure 10 comprising a light energy switch 1 and a thermosensitive light path adjustment structure 2. The light energy switch 1 is configured to switch from an open circuit to closed circuit a under light irradiation. The thermosensitive light path adjustment structure 2 is connected to a surface of the light energy switch 1, is capable of transmitting light internally, is configured to adjust a light path of light (indicated as an arrow in FIG. 1) to prevent the light from irradiating the light energy switch 1 when receiving no heat source, and is configured to adjust the light path of the light to drive the light to irradiate the light energy switch 1 when receiving a heat source. The heat source is a temperature of a fingerprint ridge.

A working principle of the fingerprint identification structure 10 is using a difference between temperatures of a fingerprint ridge and a fingerprint valley to identify a difference between signals received by the gate electrode. More specifically, a fingerprint comprises a fingerprint ridge and a fingerprint valley. When a finger touches the fingerprint identification structure 10, the fingerprint valley has no contact with the thermosensitive light path adjustment structure 2, and the fingerprint ridge contacts the thermosensitive light path adjustment structure 2. Because has a temperature, a temperature of the fingerprint ridge serving as the heat source can make the thermosensitive light path adjustment structure 2 reflect the light irradiation to the light energy switch 1. The light energy switch 1 under the light irradiation switches from an open circuit into a closed circuit such that a corresponding position is identified to have the fingerprint ridge.

The present embodiment provides a fingerprint identification structure 10 similar to a TFT device with a less thickness and without any fingerprint module to lower a manufacturing cost.

With reference to FIG. 1, in the present embodiment, the light energy switch 1 comprises a semiconductor layer 11, a source electrode 12, and a drain electrode 13. An upper surface of the semiconductor layer 11 is connected to the thermosensitive light path adjustment structure 2 and is configured to convert a semiconductor state into a conductor state under light irradiation. The source electrode 12 is electrically connected to an end of a lower surface of the semiconductor layer 11. The drain electrode 13 is electrically connected to another end of the lower surface of the semiconductor layer 11.

A material of the semiconductor layer 11 is preferably amorphous silicon. The principle thereof is that a valence electron of the semiconductor layer 11 obtains sufficient energy under the light irradiation to break away a bondage of a covalent bond to become a free electron such that a channel is defined in the semiconductor layer 11 to conduct the source electrode 12 with the drain electrode 13. The drain electrode 13 is connected to a high potential voltage, the source electrode 12 is connected to a low potential voltage such that the light energy switch 1 switches from an open circuit into a closed circuit under light irradiation.

Figure 2:
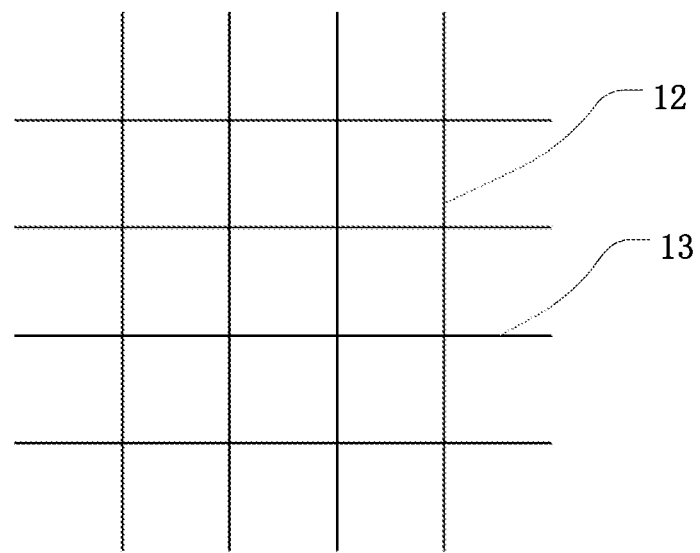

With reference to FIG. 2, in the present embodiment, preferably the source electrode 12 and the drain electrode 13 are arranged to intersect each other. More preferably, the source electrode 12 and the drain electrode 13 arranged perpendicularly.

With reference to FIG. 1, in the present embodiment, the thermosensitive light path adjustment structure 2 comprises a light selective transmission layer 21, a light transmission layer 22, a light direction control layer 23, and a light source 24.

Specifically, the light selective transmission layer 21 is disposed on the thermosensitive light path adjustment structure 2. The light transmission layer 22 is disposed on the light selective transmission layer 21 and is configured to transmit the light. The light direction control layer 23 is disposed on the light transmission layer 22 and is configured to receive the heat source and control a reflection direction of the light under effect of the heat source. Specifically, when no heat source is received, a reflection light path of the light has drives the light not to irradiate the light energy switch 1. When the heat source is received, the reflection light path of the light drives the light to irradiate the light energy switch 1. The light source 24 is disposed on a side of the light transmission layer 22, is configured to provide the light, an incident angle α of the light is greater than a total reflection angle of the light selective transmission layer 21 such that the light cannot extend out from the lower surface of the light transmission layer 22.

In the present embodiment, a refractive index of the light selective transmission layer 21 is less than a refractive index of the light transmission layer 22.

With reference to FIG. 3, in the present embodiment, when no heat source is received, in other words, when the fingerprint valley has no contact with the thermosensitive light path adjustment structure 2, a refractive index of the light direction control layer 23 is equal to the refractive index of the light transmission layer 22, the refractive index of the light direction control layer 23 is equal to the refractive index of the light transmission layer 22. Light emitted from the light source 24 cannot extend out from the lower surface of the light transmission layer 22, the semiconductor layer 11 receives no light irradiation, the signal received by the gate electrode has no variation.

With reference to FIG. 4, when the heat source is received, in other words, when the fingerprint ridge is able to contact the thermosensitive light path adjustment structure 2, both the refractive indexes of the light direction control layer 23 and the light transmission layer 22 change, and the refractive index of the light direction control layer 23 is unequal to the refractive index of the light transmission layer 22. The light direction control layer 23 reflects and drives the light to extend out from the lower surface of the light transmission layer 22 and pass through the light selective transmission layer 21 to the thermosensitive light path adjustment structure 2. The light irradiates the semiconductor layer 11 and affects a transmission thereof such that the signal received by the gate electrode changes.

With reference to FIGS. 1, 3, and 4, in the present embodiment, the light direction control layer 23 comprises a diffuse reflection surface that is with concave and convex, the diffuse reflection surface is connected to the light transmission layer 22. In other words, a boundary between the light transmission layer 22 and the light direction control layer 23 is with concave and convex. When the refractive index of the light direction control layer 23 is unequal to the refractive index of the light transmission layer 22, diffuse reflection occurs.

With reference to FIGS. 1, 3, and 4, in the present embodiment, the light transmission layer 22 comprises a plurality of recesses/holes, the light transmission layer 22 is disposed in the recesses/holes.

In the present embodiment, the diffuse reflection surface comprises a plurality of reflection units 231, a shape and a dimension of each of the reflection units 231 matches a shape and a dimension of each of the recesses/holes.

In the present embodiment, the reflection units 231 are semi-spherical and are arranged in an array. In other embodiment, a vertical cross-section of the reflection units 231 can be semi-circular, triangular, or polygonal as long as a diffuse reflection function is satisfied.

Figure 5:
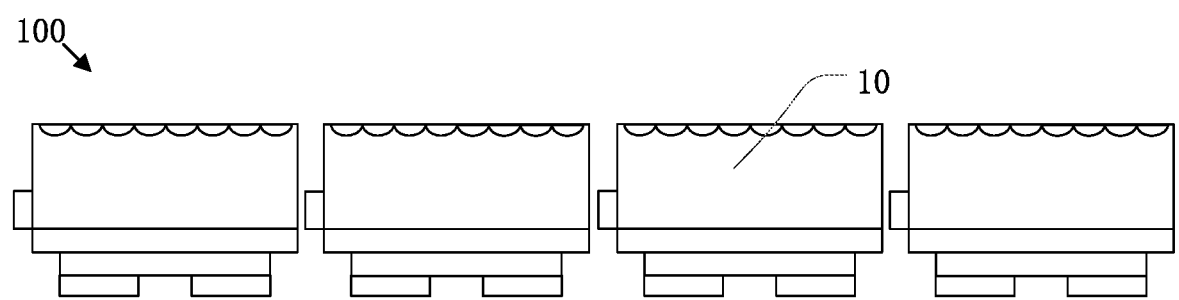

With reference to FIG. 5, the present invention also provides a display panel 100 comprising the fingerprint identification structure 10 as described above. Specifically, fingerprint identification structures 10 are arranged in an array. The fingerprint identification structure 10 can be integrated on the display panel 100, which can lower the thickness and the cost of the display panel 100.

Advantages of display panel 100 provided by the embodiment of the present invention are the same as advantages of the fingerprint identification structure 10 provided by the above technical solution and will not be repeatedly.

The display panel 100 provided by the above embodiments can be any product or component including display functions such as a cell phone, a tablet, a television, a monitor, a notebook, a digital photo frame, or a navigator.

In the descriptions of the above embodiments, specific features, structures, materials or characteristics can be combined in a suitable way in any one or more embodiments or examples.

The technical effect of the present invention is to provide a fingerprint identification structure and a display panel that lower a manufacturing cost by setting forth a fingerprint identification structure similar to a TFT device with a less thickness and without a fingerprint module. Also, the fingerprint identification structure can be integrated into a display panel, which lowers a thickness and a cost of the display panel.

The above is only preferred embodiments of the present invention. It should be noted that a person of ordinary skill in the art can make several improvements and modifications without departing from the principle of the present invention. These improvements and modifications should also be considered to be within the scope of protection of the present invention.

What is claimed is:
1. A fingerprint identification structure, comprising:
a light energy switch configured to switch from an open circuit thereof into a closed circuit thereof under light irradiation; and
a thermosensitive light path adjustment structure connected to a surface of the light energy switch, capable of transmitting light internally, configured to adjust a light path of light to prevent the light from irradiating the light energy switch when receiving no heat source, and configured to adjust the light path of the light to drive the light to irradiate the light energy switch when receiving a heat source;
wherein the heat source is a temperature of a fingerprint ridge, and
wherein the thermosensitive light path adjustment structure comprises:
a light selective transmission layer disposed on the surface of the light energy switch;
a light transmission layer disposed on the light selective transmission layer and configured to transmit the light, wherein the light selective transmission layer is located between the light transmission layer and the light energy switch in a direction perpendicular to the surface of the light energy switch;
a light direction control layer disposed on the light transmission layer and configured to receive the heat source and control a reflection direction of the light under effect of the heat source, wherein the light transmission layer is located between the light direction control layer and the light selective transmission layer in the direction perpendicular to the surface of the light energy switch; and
a light source disposed on a side of the light transmission layer and configured to provide the light, wherein an incident angle of the light is greater than a total reflection angle of the light selective transmission layer.
2. The fingerprint identification structure as claimed in claim 1, wherein the light energy switch comprises:

a semiconductor layer, wherein an upper surface of the semiconductor layer is connected to the thermosensitive light path adjustment structure, and configured to convert from a semiconductor state thereof into a conductor state thereof under the light irradiation;

a source electrode electrically connected to an end of a lower surface of the semiconductor layer; and.

a drain electrode electrically connected to another end of the lower surface of the semiconductor layer.

3. The fingerprint identification structure as claimed in claim 1, wherein a refractive index of the light selective transmission layer is less than a refractive index of the light transmission layer.

4. The fingerprint identification structure as claimed in claim 3, wherein when no heat source is received, a refractive index of the light direction control layer is equal to the refractive index of the light transmission layer; and when the heat source is received, the refractive index of the light direction control layer is unequal to the refractive index of the light transmission layer, and the light direction control layer reflects and transmits the light to pass through the light selective transmission layer to the thermosensitive light path adjustment structure.

5. The fingerprint identification structure as claimed in claim 1, wherein the light direction control layer comprises a diffuse reflection surface with concave and convex, and the diffuse reflection surface is connected to the light transmission layer.

6. The fingerprint identification structure as claimed in claim 5, wherein the light transmission layer comprises a plurality of recesses/holes, and the light transmission layer is disposed in the recesses/holes.

7. The fingerprint identification structure as claimed in claim 6, wherein the diffuse reflection surface comprises a plurality of reflection units, and a shape and a dimension of each of the reflection units matches a shape and a dimension of each of the recesses/holes.

8. The fingerprint identification structure as claimed in claim 7, wherein the reflection units are semi-spherical and are arranged in an array.

9. A display panel, comprising the fingerprint identification structure as claimed in claim 1.

* * * * *